United States Patent [19]

Lin

[11] 4,456,371
[45] Jun. 26, 1984

[54] OPTICAL PROJECTION PRINTING THRESHOLD LEVELING ARRANGEMENT

[75] Inventor: Burn J. Lin, Katonah, N.Y.

[73] Assignee: International Business Machines Corporation, Armonk, N.Y.

[21] Appl. No.: 393,921

[22] Filed: Jun. 30, 1982

[51] Int. Cl.³ ............................................. G03B 27/72
[52] U.S. Cl. ...................................... 355/71; 355/125
[58] Field of Search ...................... 355/70, 71, 40, 43, 355/125

[56] References Cited

U.S. PATENT DOCUMENTS

| | | | |
|---|---|---|---|
| 2,951,736 | 9/1960 | Black | 346/1 |
| 3,531,196 | 9/1970 | Kosanke et al. | 355/18 |
| 3,579,338 | 5/1971 | Ooue et al. | 96/50 |
| 3,610,750 | 10/1971 | Lewis et al. | 355/43 |
| 3,673,932 | 7/1972 | Rottmiller | 355/43 X |
| 3,673,933 | 7/1972 | Hamann | 355/43 X |
| 3,718,396 | 1/1973 | Hennings | 355/43 |
| 3,758,207 | 9/1973 | Letzer | 355/71 X |
| 3,764,211 | 10/1973 | Morse et al. | 355/71 |
| 3,782,821 | 1/1974 | Bosman | 355/70 |
| 3,982,819 | 9/1976 | Hirth | 355/1 |
| 4,040,736 | 8/1977 | Johannsmeier | 355/43 |
| 4,063,812 | 12/1977 | Abraham et al. | 355/18 |

Primary Examiner—Richard A. Wintercorn
Attorney, Agent, or Firm—G. E. Roush; Otto Schmid, Jr.

[57] ABSTRACT

Semiconductor fabrication using optical projection apparatus is enhanced in an arrangement having means for producing exposures tailored to the patterns on the conventional photo-mask. A predetermined correction photo-mask capable of producing different exposure levels according to the original mask pattern is superimposed with the original mask on the semiconductor wafer by sequential double exposure using an additional mask change and alignment.

A better arrangement provides two beams simultaneously illuminating the two masks; the two beams are recombined with a high quality beam splitter arrangement before reaching the imaging lens. The two masks only have to be aligned to each other once. Afterwards, the wafer is exposed regularly. Therefore, an uncorrected image has the lowest threshold for an isolated opening, medium threshold for equal lines and spaces, high threshold for an isolated opaque line. After the correction scheme, all thresholds are made equal.

The correction mask is made of grainless dyes of different light transmission or of one semitransparent substance of different thickness, such as thin layers of iron oxide, chromium or silicon. Standard lithographic patterning techniques, such as subtractive etching, lift off or plating are used to fabricate the correction mask.

4 Claims, 21 Drawing Figures

OPTICAL PROJECTION PRINTING THRESHOLD LEVELING ARRANGEMENT

Field

The invention relates to optical projection printing especially as used in semiconductor device fabrication, and it particularly pertains to arrangements for insuring proper optical exposure in projecting mask patterns onto semiconductor substrates and the like.

Background

Much work has been done in optical projection printing processes for semiconductor device fabrication. An excellent summary of this type of processing is found in two articles, authored by the applicant, listed at the end of the description of the invention.

In such optical projection printing operations, the feature size of the developed resist image is a function of exposure for a given development time. The proper threshold is set by either minimizing the difference of the image linewidth to that on the mask or by minimizing the linewidth variation caused by incremental change of the exposure conditions. For the same feature size but different shapes, the exposure threshold may be quite different. For example, the exposure threshold for an isolated opening is much lower than that of an isolated opaque line when the linewidth is near the resolution limit of the lens. Therefore, in an actual integrated circuit mask encompassing many different shapes and sizes, one uniform exposure and development may produce quite large pattern dependent variations of linewidth bias.

Summary

According to the invention, the objects indirectly referred to hereinbefore and those that will appear as the specification progresses are attained in an arrangement having means for producing exposures tailored to the patterns on the mask. A predetermined correction mask capable of producing different exposure levels according to the original mask pattern is superimposed with the original mask on the semiconductor wafer by sequential double exposure using an additional mask change and alignment. To eliminate replicating the mask changes a complete set of identical wafers is exposed first with the original mask, then returned for exposure with the correction mask before wafer development.

A better arrangement provides two beams simultaneously illuminating the two masks; the two beams are recombined with a high quality beam splitter arrangement before reaching the imaging lens. The two masks only have to be aligned to each other once. Afterwards, the wafer is exposed regularly. Therefore, an uncorrected image has the lowest threshold for an isolated opening, medium threshold for equal lines and spaces, high threshold for an isolated opaque line. After the correction scheme, all thresholds are made equal.

The two iluminating beams originate from two separate sources or are split from one common source using fiber bundles. Beam splitters and mirrors are also used as well as many well known schemes of splitting one light beam into two.

The correction mask is made of grainless dyes of different light transmission or of one semitransparent substance of different thickness, such as thin layers of iron oxide, chromium or silicon. Standard lithographic patterning techniques, such as subtractive etching, lift off or plating are used to fabricate the correction mask.

Prior Art

The state-of-the-art is determinable from the following pertinent U.S. patents:

| | | | |
|---|---|---|---|
| 2,951,736 | 9/1960 | Black | 346/1 |
| 3,531,196 | 9/1970 | Kosanke et al | 355/18 |
| 3,579,338 | 5/1971 | Shingo Ooue et al | 430/21 |
| 3,610,750 | 10/1971 | Lewis et al | 355/43 |
| 3,673,932 | 7/1972 | Rottmiller | 355/43 |
| 3,673,933 | 7/1972 | Hamann | 355/43 |
| 3,718,396 | 2/1973 | Hennings | 355/43 |
| 3,782,821 | 1/1974 | Bosman | 355/70 |
| 4,063,812 | 12/1977 | Abraham et al | 355/18 |
| 3,982,829 | 9/1976 | Hirth | 355/1 |
| 4,040,736 | 8/1977 | Johannsmeier | 355/43 |

These patents include several showing the use of double and/or split light beams superimposed in desirable registry for purposes other than correction and/or intensity threshold compensation.

The closest art probably resides in the patents to Rottmiller and to Hamann which show different light sources but no arrangements for adjusting exposure threshold is even suggested.

Drawing

In order that all the advantages of the invention obtain in practice, the best mode embodiment thereof, given by way of example only, is described in detail hereinafter, with reference to the accompanying drawing, forming a part of the specification, and in which:

FIG. 8B, C, and D depict the correcting mask and the corresponding light intensity levels after correction.

Description

Figure 1:
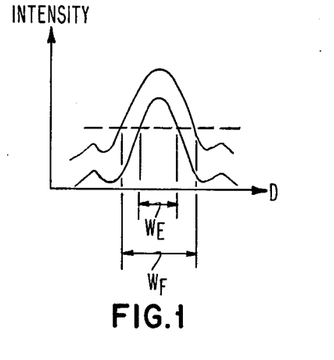
FIG. 1 is a graphical representation of a typical intensity distribution pattern.

In optical projection printing the feature size of the developed resist image is particularly a function of the exposure for a given development time. An example of this may better be understood by referring to FIG. 1, graphically representing a typical intensity distribution pattern of an isolated holiday (break) in the line. In the first order, a linewidth $W_E$ is obtained by setting the exposure threshold at E. A larger linewidth $W_E$ is obtained on biasing the intensity upwards, that is a greater light intensity or exposure to light. The proper threshold set by either minimizing the difference of the image linewidth to that on the mask or by minimizing the linewidth variation caused by incremental change of the exposure conditions. For the same feature size but different shape, the exposure threshold may be different. For example, the exposure threshold for an isolated holiday (or opening) is much lower than that of an isolated opaque line when the linewidth is near the resolution limit of the lens, that is 0.6 $\lambda/A$, where $\lambda$ is the exposure wavelength and A is the numerical aperture of the imaging lens. Therefore, in an actual integrated circuit mask encompassing many different shapes and sizes, one uniform exposure and development is apt to produce large pattern dependent variations of linewidth bias.

According to the invention, the components of the fabrication setup are arranged to provide an exposure that is tailored to the patterns on the mask. A predetermined correction mask capable of producing different exposure levels according to the original mask pattern is superimposed with the original mask on the wafer by sequential double exposure using an additional mask change and alignment. To eliminate replicating the mask changes a complete set of identical wafers is exposed first with the original mask, then the set is returned for exposure with the correction mask before wafer development.

Figure 2:
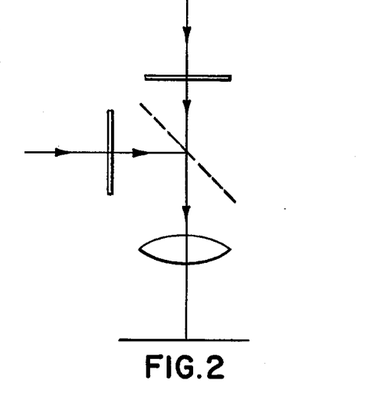
FIG. 2 is a schematic diagram of an optical setup for the practice of the invention.
Figure 3A:
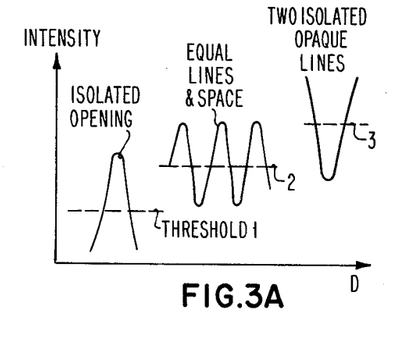
FIG. 3A and 3B are graphical representations of waveforms at different threshold values before and after threshold leveling.
Figure 3B:
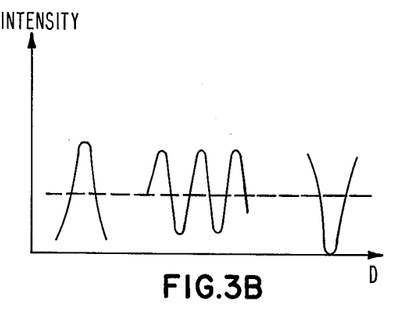

A better plan is to use two beams simultaneously illuminating the two masks, then recombine the two unmodulated beams with a high quality beam splitting arrangement before reaching the imaging lens as shown in FIG. 2. The two masks only have to be aligned once to each other. Afterwards, the wafer is exposed normally. Therefore, as shown in FIG. 3, an uncorrected image has the lowest threshold for an isolated holiday medium threshold for equal lines and spaces, high threshold for an isolated opaque line. After the correction scheme, all thresholds are made substantially equal.

The two illuminating beams may originate from two separate sources or may be split from one common source using fiber bundles and the like. Conventional beam splitters and mirrors also may be used as well as many well known schemes of splitting a high beam into two.

Figure 4:
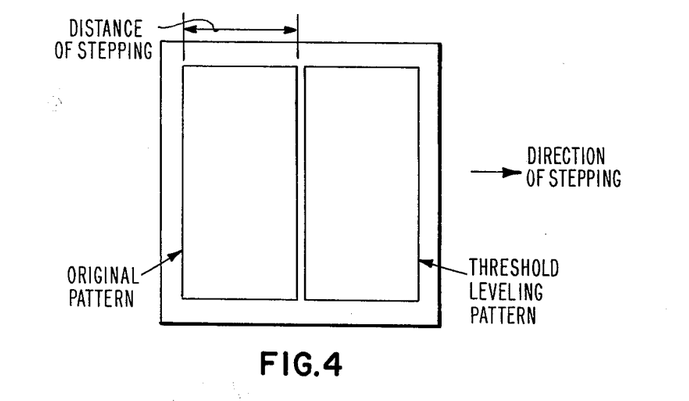
FIG. 4 is a diagram of a mask arrangement for a "step and repeat" method.

In addition to the double-exposure and the beam-combining methods described above, another method can be used for threshold leveling when a step-and-repeat operation is performed. The pattern mask and the threshold leveling mask can be made on one mask plate, each occupying half of the mask plate according to the direction of stepping as shown in FIG. 4. Exposing the entire mask with steps covering only half of the mask results in double exposures equivalent superimposing the pattern mask and the threshold leveling mask together.

The correction mask is preferably made of grainless dyes of different light transmission or of one semitransparent substance of different thickness, such as thin layers of iron oxide chromium or silicon. Standard lithographic patterning techniques, such as subtractive etching, lift off or plating are used to fabricate the correction mask.

Usually, the isolated features are more contrasty than equal lines and spaces. In a less critical situation when the correction has to be done only on the more contrasty features, the two masks are attached together as if one mask. The threshold of the isolated features is adjusted at the expense of lower contrast. Three types of threshold leveling patterns are practical for a particular set of patterns depending on the contrast of the patterns in conjunction with the performance of the exposure tool and the resist system. The first, Type I, changes the threshold but lowers the contrast of the image; the second, Type II, changes only the threshold, and the third, Type III, changes the threshold with an improvement of contrast. These three types are discussed in detail hereinafter, using a number of actual mask patterns of semiconductor integrated circuits as examples.

Figure 5A:
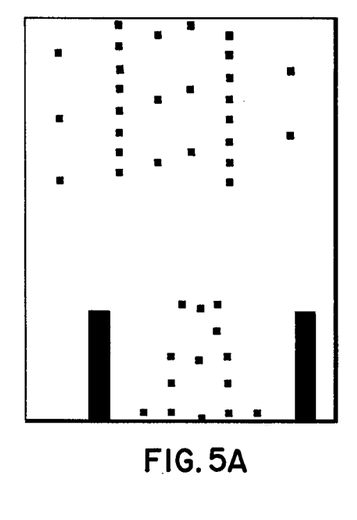
FIG. 5A is an illustration of a "contact hole" mask.
Figure 5B:
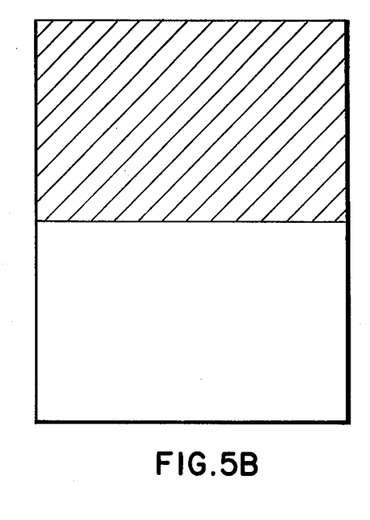
FIG. 5B and 5C are diagrams illustrating "corrective" masks.
Figure 5C:
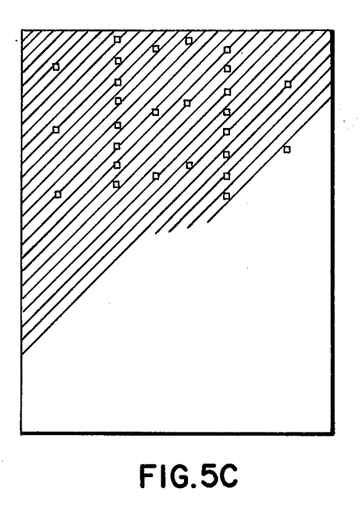
Figure 5D:
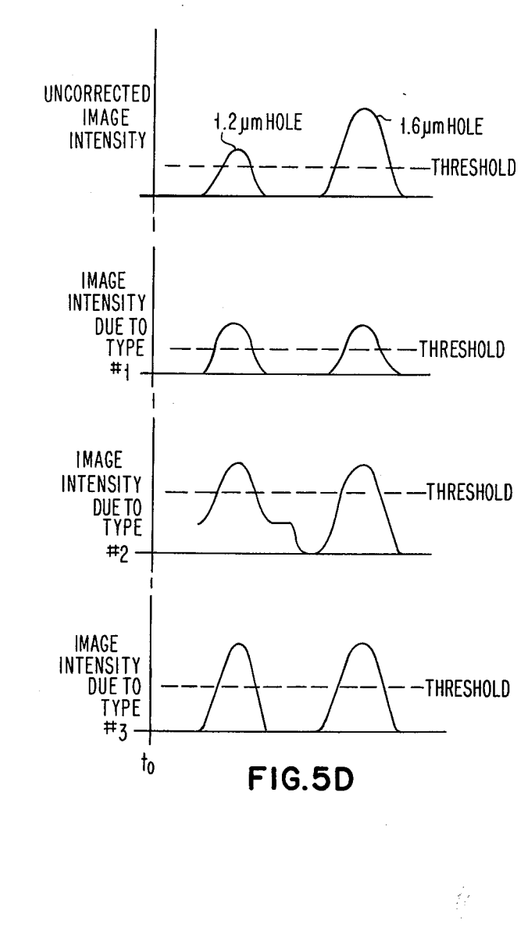
FIG. 5D is a graphical representation of the light intensity of an uncorrected mask for companion with the resulting light intensity of three different correcting masks.

FIG. 5A shows a typical pattern from a contact hole mask. Groups A and B consist of 1.2 $\mu$m and 1.6 $\mu$m square contact holes respectively. The Type I method simply makes pattern B less transparent on the same mask without going into beam splitting and recombination. For Type II a threshold leveling mask shown in FIG. 5D is used. The shaded part can be a semitransparent material or an opaque material. In the latter case, the intensity differentiation of the two split beams is adjusted to produce an optimum balance. The Type III method uses a threshold leveling mask as shown in FIG. 5C. The material of the shaded part is similarly considered as in connection with Type II. The intensity of a 1.2 $\mu$m and a 1.6 $\mu$m hole due to these leveling schemes is shown in FIG. 5D. The Type I method is obviously the easiest to implement but is applicable only when the contrast of the larger features is sufficiently high, so that after threshold leveling, the resultant contrast of the larger features is still comparable to that of the un-levelled features. The Type II method can be used when the contrast fo the smallest feature is sufficient for resolution and linewidth control. Threshold leveling in this case serves to eliminate the need to bias the dimension of the mask patterns differently due to shape, dimension, and proximity changes. The use of the Type III method enhances the contrast of the smallest features. However, this scheme requires a high alignment accuracy between the pattern mask and the threshold leveling mask. For reduction projection systems, the requirement can easily be fulfilled because this alignment is at the enlarged mask planes. For 1X systems, even though a higher accuracy is necessary, this only has to be done once for every mask change and can be carefully set up regardless of wafer throughput.

Figure 6A:
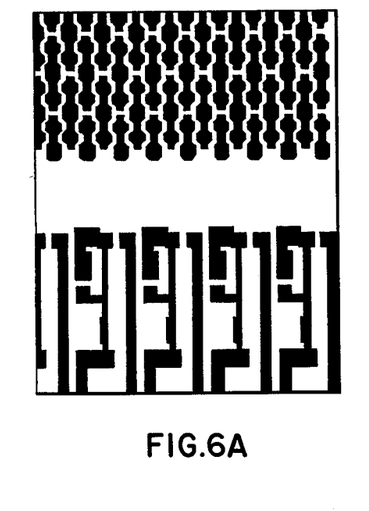
FIG. 6A depicts a semiconductor circuit device production mask for the recessed oxide level.
Figure 6B:
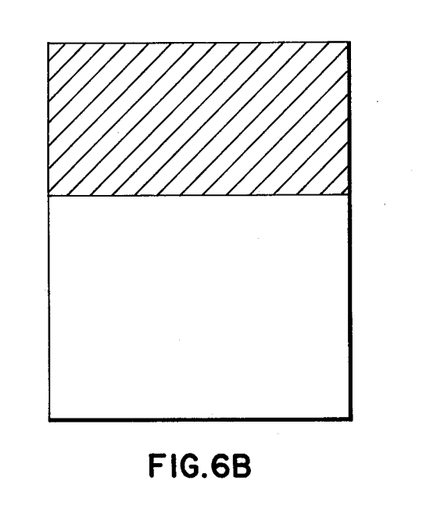
FIGS. 6B and 6C illustrate two types of masking for correcting the production mask.
Figure 6C:
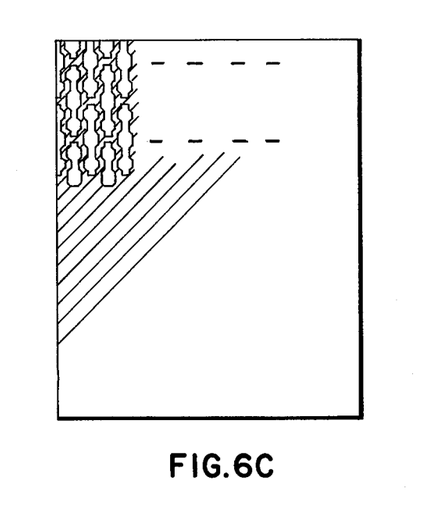
Figure 7A:
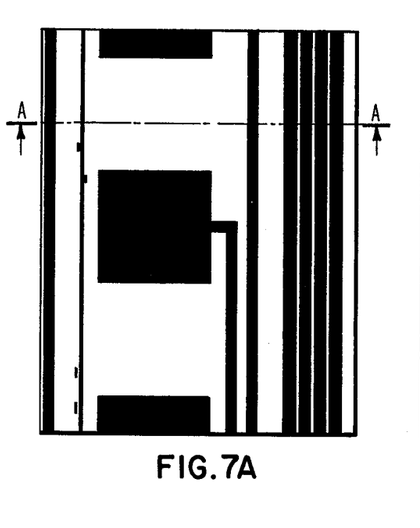
FIGS. 7A, 7B and 7C illustrate a similar set of original and correcting masks.
Figure 7B:
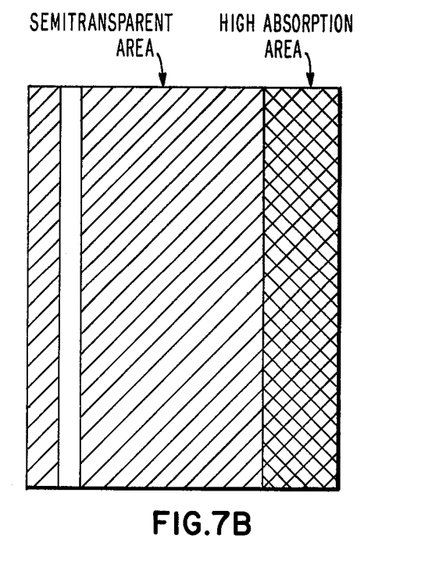
Figure 7C:
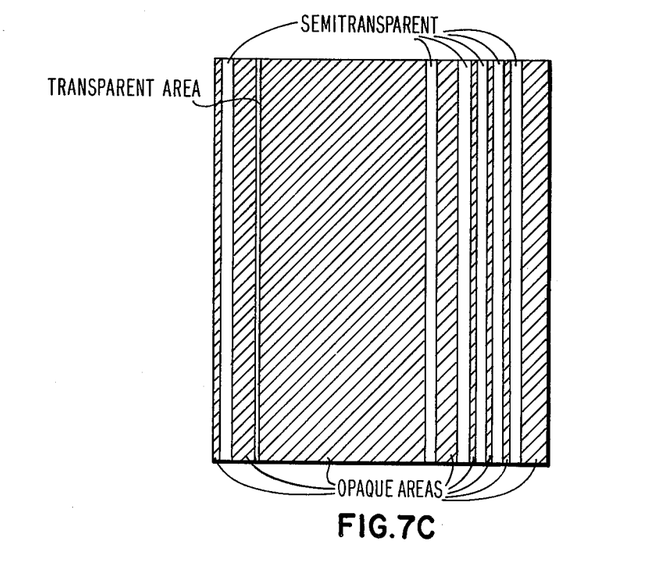
Figure 7D:
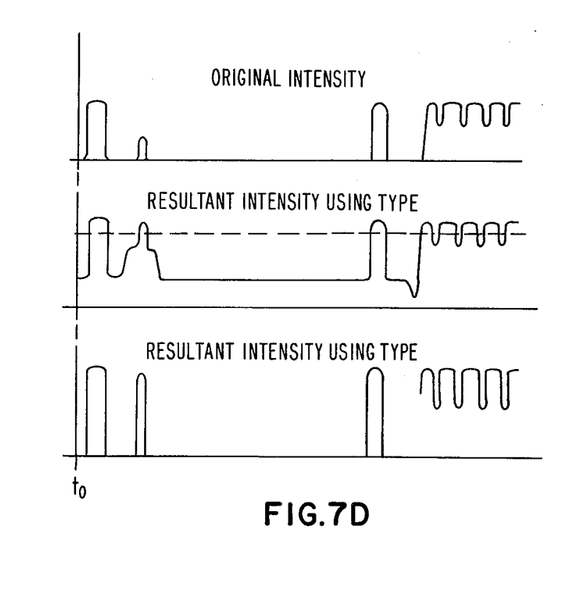
FIG. 7D is a schematic diagram comparing the light intensity distributions obtained with these masks.
Figure 8A:
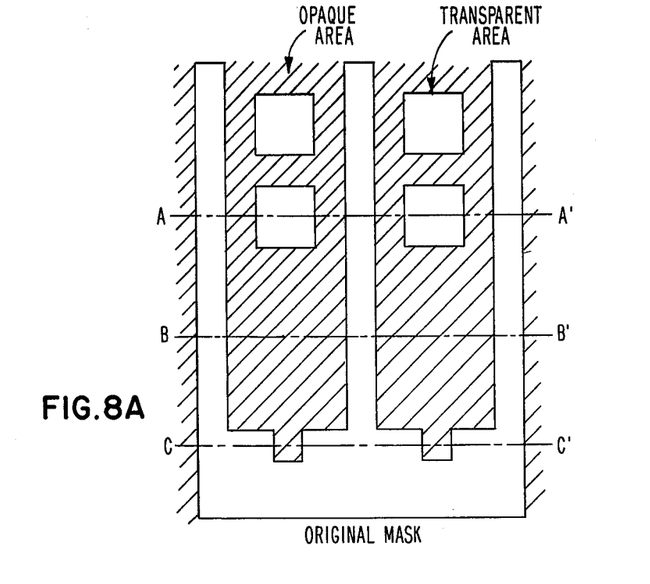
FIGS. 8A and 8B depict an original mask and a graphical representation of light intensity levels encountered along three specific lines.
Figure 8B:
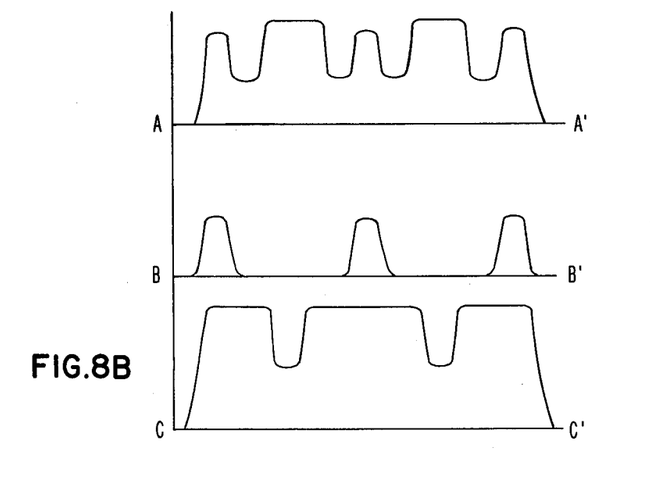
Figure 8C:
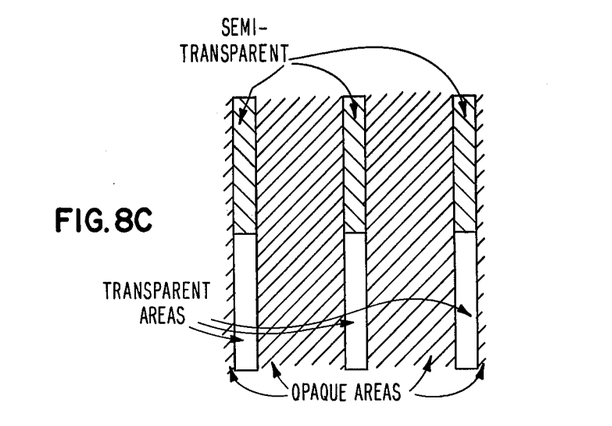
Figure 8D:
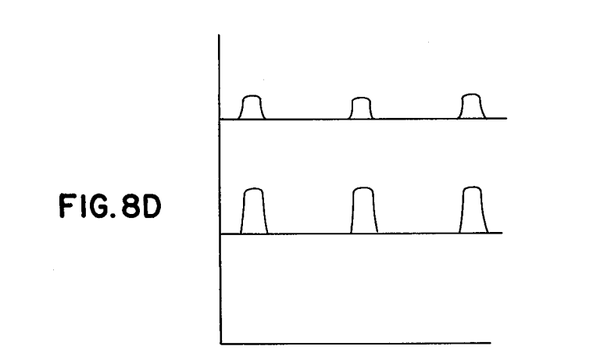
Figure 8E:
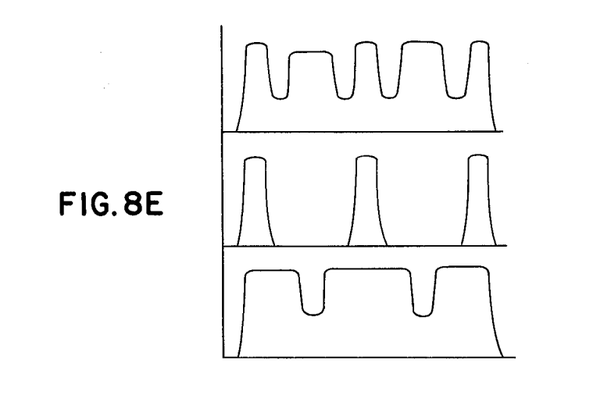

FIG. 6A shows a Direct Access Storage (DAS) circuit at the recessed oxide level of an integrated circuit wafer. Here, the minimum feature is the opaque lines between the "figure eight" cells. When contrast is sufficient, the threshold leveling mask according to the Type II method is shown in FIG. 6B. The other threshold leveling mask shown in FIG. 6C was used according to scheme #3. Fig. 7A shows a metal level pattern for a Charge Coupled Device (CCD) circuit. A few minimum opaque line and a minimum line opening were used on the same mask. The threshold leveling masks according to Type II and III are shown in FIGS. 7B and 7C respectively. The intensities before and after threshold leveling at the intersection AA' are shown in FIG. 7D. To optimize Type III for this particular example, the intensity incident on the threshold leveling mask more than that on the pattern mask, so that the improvement of the minimum opening can be more than a factor of 2. Slightly below the AA' line, a short rectangular opening is found near the minimum opening. To properly correct for this, a more elaborate breaking of the threshold leveling pattern is used. This can be illustrated by another example shown in FIGS. 8 (FIG. 8A, 8B, 8C, 8D and 8E being taken together).

The Type III method actually can be implemented with perfect alignment of the enhanced patterns. Instead of using two masks in parallel, an obstructing mask which has windows at the location of the enhanced features is superpositioned with the pattern mask for a second exposure after the conventional first exposure with the unobstructed pattern mask. For example, the mask of FIG. 5B is used to cover the pattern mask of FIG. 5A in a second exposure, after the entire mask shown in FIG. 5A is exposed. Different degrees of enhancement can be achieved by using a multi-gray-level obstructing mask or by successive exposures with different obstructing masks.

The foregoing figures of drawing and examples were used only to illustrate the principle of threshold leveling. In order to accurately predict threshold leveling conditions, the optical diffraction from 2-dimensional patterns with partially coherent illumination has to be simulated. The equations and computer programs given in the references listed below will be found helpful in the practice of the invention.

1. B. J. Lin, "Partially Coherent Imaging in Two Dimensions and the Theoretical Limits of Projection Printing in Microfabrication", IEEE Trans. Electron Devices, vol. ED-27, p. 931, 1980.
2. B. J. Lin, "Theory and Practice of Deep-uv and Near-uv Lithography", Proceedings of the International Conference on Micro- lithography, Swiss Federal Institute of Technology, Lausanne, Switzerland, p. 47, 1981.

While the invention has been described in terms of express embodiments, and alternatives have been suggested, it is clearly to be understood that those skilled in the art will effect further changes in form and in substance without departing from the spirit and scope of the invention as defined in the appended claims concluding the specification.

The invention claimed is:

1. An optical projection system for projecting a desired composite image at an image plane structure, comprising
    one mask having the desired image transparency but which will result in undersirable intensity distribution at said image plane, and
    another mask having an image transparency comprising at least two discrete areas, each of said areas having a predetermined optical density that is the same throughout the area, said optical density of said discrete areas being chosen to correct for said intensity distribution at said image plane, and
    an optical system for projecting light through both of said transparencies to said structure resulting in a threshold corrected image at said image plane structure.

2. An optical projection system as defined in claim 1 and wherein
    said optical system comprises
    an optical beam splitting member having the plane surface thereof arranged at an angle of 45° to the image plane sturcture and spaced therefrom for optical image projection thereon,
    one of said masks having the plane surface thereof arranged at an angle of 45° to said beam splitting member and at an angle of 90° to said image plane and aligned therewith for projecting an image onto said structure,
    the other of said masks having the plane surface thereof arranged parallel to said image plane and at an angle of 45° to said beam splitting member and aligned therewith for projecting an image through said beam splitting member and onto said structure in registry with the image from said one mask,
    a source of light, and
    optical lens member for focusing light onto said masks for projecting the images onto said image plane structure.

3. An optical projection system as defined in claim 1 and wherein,
    said one mask has the lowest optical threshold for an isolated holiday, intermediate thresholds for equally divided lines and spaces, and a high threshold for an isolated opaque line, and
    said other mask comprising discrete areas having corresponding thresholds of inverse relationship whereby the resulting composite threshold levels are substantially equal.

4. An optical projection system as defined in claim 1 and wherein;
    said one mask and said other mask are arranged side-by-side on one mask plate; and
    a carriage is arranged to receive said plate and to project light sequentially, first through one transparency and then the other, onto said image plane structure.

* * * * *